(12) United States Patent
Apalkov et al.

(10) Patent No.: US 10,062,732 B2
(45) Date of Patent: Aug. 28, 2018

(54) DMTJ STRUCTURE FOR SUB-25NM DESIGNS WITH CANCELLED FLOWERING FIELD EFFECTS

(71) Applicant: Samsung Electronics Co., Ltd., Suwon-si, Gyeonggi-do (KR)

(72) Inventors: Dmytro Apalkov, San Jose, CA (US); Mohamad Krounbi, San Jose, CA (US); Vladimir Nikitin, Campbell, CA (US); Volodymyr Voznyuk, Fremont, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/272,413

(22) Filed: Sep. 21, 2016

(65) Prior Publication Data

US 2017/0345868 A1    Nov. 30, 2017

Related U.S. Application Data

(60) Provisional application No. 62/341,066, filed on May 24, 2016.

(51) Int. Cl.
*H01L 27/22* (2006.01)
*G11C 11/16* (2006.01)
*H01L 43/02* (2006.01)
*H01L 43/08* (2006.01)
*H01L 43/10* (2006.01)

(52) U.S. Cl.
CPC .......... *H01L 27/222* (2013.01); *G11C 11/161* (2013.01); *H01L 43/02* (2013.01); *H01L 43/08* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 8,978,240 B2 * | 3/2015 | Zhang | B82Y 10/00 29/603.11 |
| 8,981,503 B2 | 3/2015 | Beach et al. | |
| 9,082,960 B2 | 7/2015 | Jan et al. | |
| 2014/0035075 A1 * | 2/2014 | Zhu | H01L 43/08 257/421 |
| 2015/0263266 A1 | 9/2015 | Gottwald et al. | |

(Continued)

*Primary Examiner* — Khaja Ahmad
(74) *Attorney, Agent, or Firm* — Renaissance IP Law Group LLP

(57) ABSTRACT

A magnetic memory device comprises a first reference magnetic layer, a first tunnel barrier layer, a second tunnel barrier layer, and a free magnetic layer disposed between the first tunnel barrier layer and the second tunnel barrier layer. A magnitude of an in-plane magnetostatic field from the first reference magnetic layer at an edge of the free magnetic layer is less than about 500 Oe. One embodiment comprises a second reference magnetic layer on the second tunnel barrier layer in which the first reference magnetic layer, the first tunnel barrier layer, the free magnetic layer, the second tunnel barrier layer and the second reference magnetic layer are arranged as a stack, and in which a width of the first tunnel barrier layer, the free magnetic layer, the second tunnel barrier and the second reference magnetic layer in a second direction is less than about 30 nm.

12 Claims, 5 Drawing Sheets

(56) References Cited

U.S. PATENT DOCUMENTS

2015/0372225 A1* 12/2015 Gaidis .................... H01L 43/08
257/421
2017/0125481 A1* 5/2017 Kan ..................... H01L 27/228

* cited by examiner

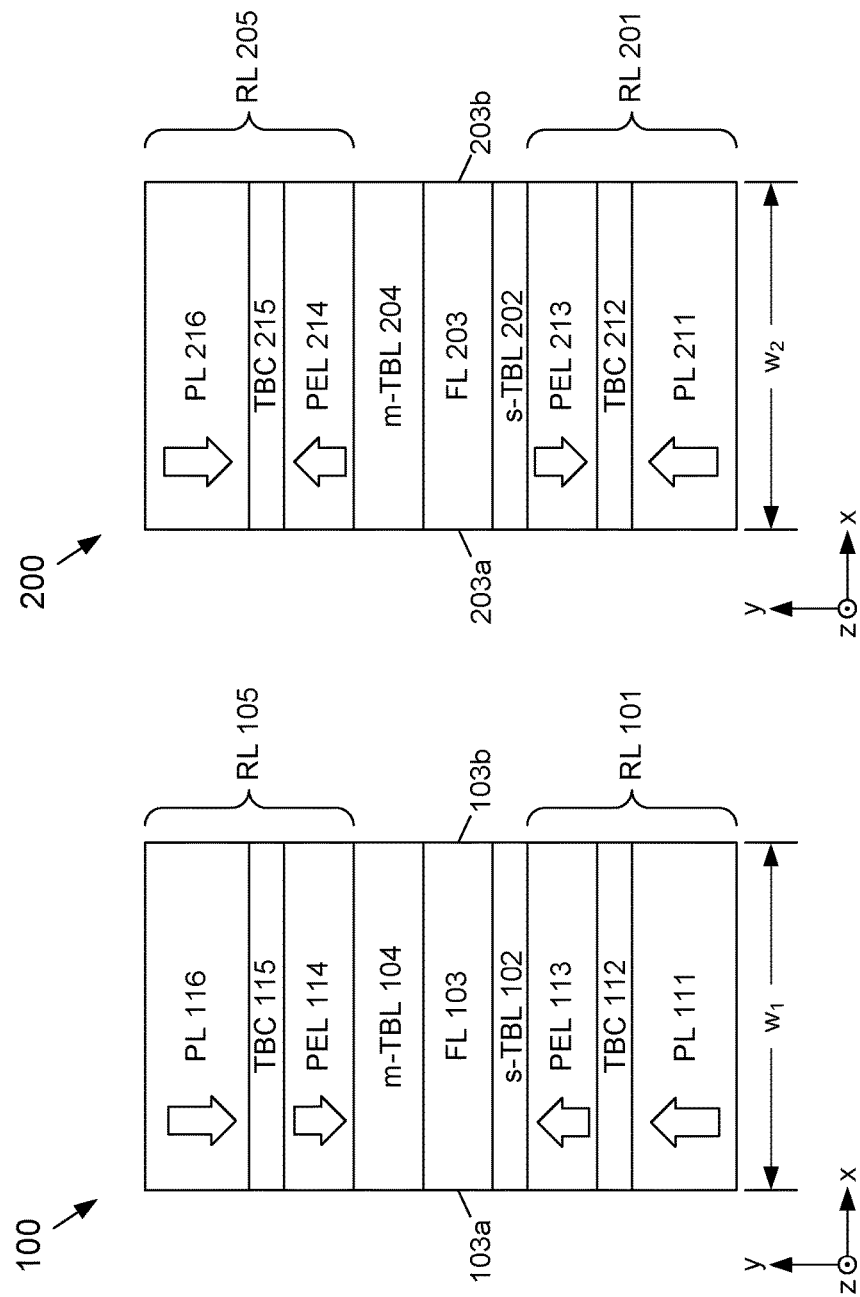

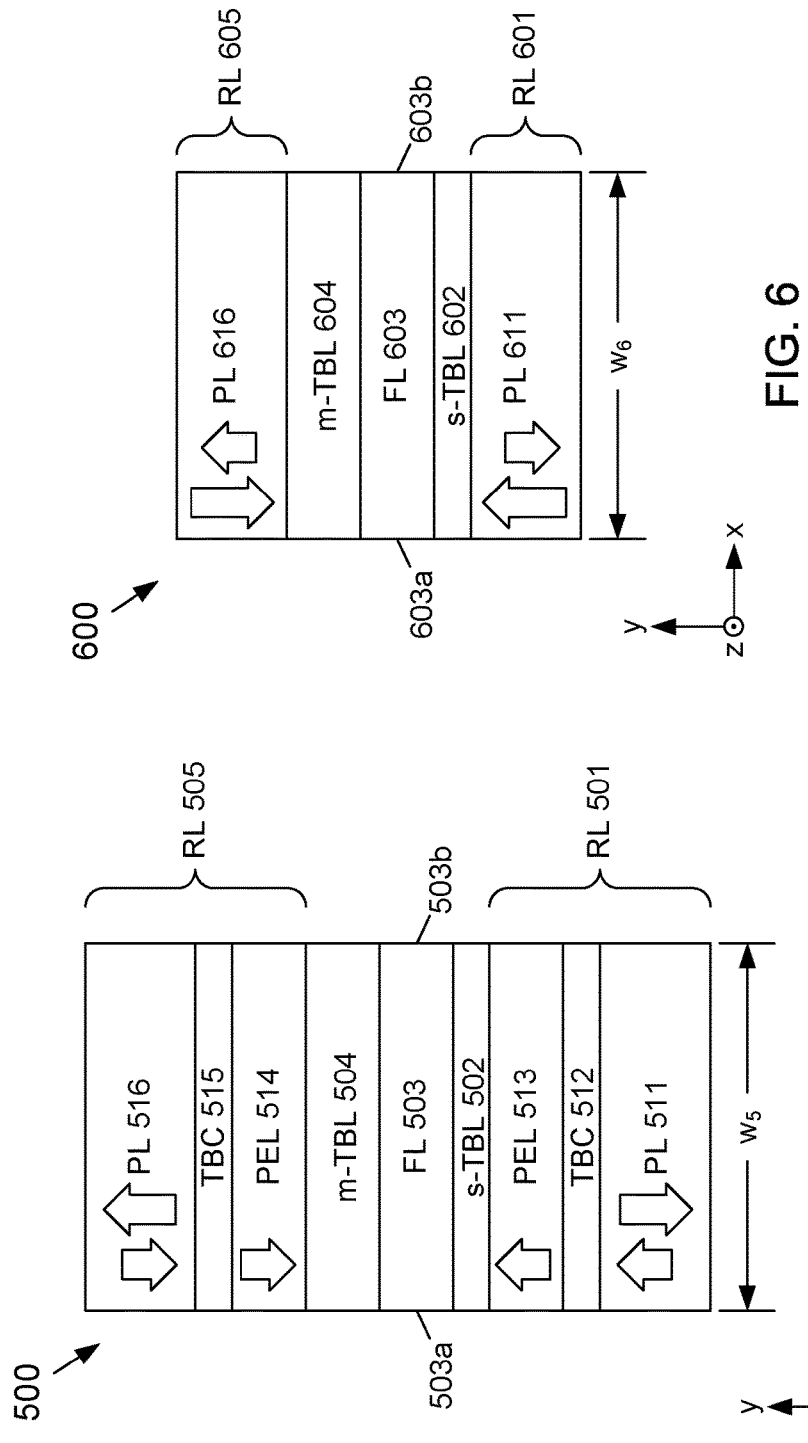

DMTJ STRUCTURE FOR SUB-25NM DESIGNS WITH CANCELLED FLOWERING FIELD EFFECTS

CROSS-REFERENCE TO RELATED APPLICATION

This patent application claims the priority benefit under 35 U.S.C. § 119(e) of U.S. Provisional Patent Application No. 62/341,066, filed on May 24, 2016, the disclosure of which is incorporated herein by reference in its entirety.

TECHNICAL FIELD

The subject matter disclosed herein generally relates to memory devices, and more particularly, to a magnetic memory device.

BACKGROUND

Commonly known magnetic memory devices may include a magnetic tunnel junction pattern (MTJ) that is formed by two magnetic substances and an insulation layer interposed therebetween. The resistance value of the MTJ pattern may be varied according to the magnetization directions of the two magnetic substances with respect to each other. In some embodiments, a switching current $J_{c0}$ is passed through the MTJ pattern to vary the magnetization direction of one of the magnetic substances with respect to the other magnetic substance. If the magnetization directions of the two magnetic substances are anti-parallel to each other, the magnetic tunnel junction pattern may have a high resistance value. If the magnetization directions of the two magnetic substances are parallel to each other, the magnetic tunnel junction pattern may have a low resistance value. The difference between the resistance values of the two magnetization states may be used to write/read data.

SUMMARY

An exemplary embodiment provides a magnetic memory device that may comprise a first reference magnetic layer, a first tunnel barrier layer on the first reference layer, a second tunnel barrier layer, and a free magnetic layer disposed between the first tunnel barrier layer and the second tunnel barrier layer in which a magnitude of an in-plane magnetostatic field from the first reference magnetic layer at an edge of the free magnetic layer may be less than about 500 Oe. One embodiment includes a second reference magnetic layer on the second tunnel barrier layer in which the first reference magnetic layer, the first tunnel barrier layer, the free magnetic layer, the second tunnel barrier layer and the second reference magnetic layer being arranged as a stack in a first direction, and in which a width of the first tunnel barrier layer, the free magnetic layer, the second tunnel barrier and the second reference magnetic layer in a second direction may be less than about 30 nm, the second direction being substantially perpendicular to the first direction.

An exemplary embodiment provides a magnetic memory device that may comprise a first reference magnetic layer, a first tunnel barrier layer on the first reference layer, a second tunnel barrier layer, and a free magnetic layer disposed between the first tunnel barrier layer and the second tunnel barrier layer in which the first reference magnetic layer, the first tunnel barrier layer, the free magnetic layer and the second tunnel barrier layer are arranged as a stack in a first direction, and in which a width of the first tunnel barrier layer, the free magnetic layer, the second tunnel barrier and the second reference magnetic layer in a second direction may be less than about 30 nm, the second direction being substantially perpendicular to the first direction. A magnitude of an in-plane magneto static field from the first reference magnetic layer at an edge of the free magnetic layer may be less than about 500 Oe.

An exemplary embodiment provides a memory device that may comprise a plurality of memory cells arranged in an array, and an interface coupled to the plurality of memory cells to receive data to be stored in at least one memory cell and to output data from at least one memory cell, at least one memory cell may comprise a magnetic memory device may comprise a first reference magnetic layer, a first tunnel barrier layer on the first reference layer, a second tunnel barrier layer, and a free magnetic layer disposed between the first tunnel barrier layer and the second tunnel barrier layer in which a magnitude of an in-plane magnetostatic field from the first reference magnetic layer at an edge of the free magnetic layer may be less than about 500 Oe. A width of the first tunnel barrier layer, the free magnetic layer, the second tunnel barrier and the second reference magnetic layer of the at least one magnetic memory device in a second direction may be less than about 30 nm in which the second direction being substantially perpendicular to the first direction.

BRIEF DESCRIPTION OF THE DRAWINGS

In the following section, the aspects of the subject matter disclosed herein will be described with reference to exemplary embodiments illustrated in the figures, in which:

FIG. 1 depicts a cross-sectional view of a first embodiment of a dual magnetic tunnel junction (DMTJ) device according to the subject matter disclosed herein;

FIG. 2 depicts a cross-sectional view of a second embodiment of a DMTJ device according to the subject matter disclosed herein;

FIG. 5 depicts a cross-sectional view of a fifth embodiment of a DMTJ device according to the subject matter disclosed herein;

FIG. 6 depicts a cross-sectional view of a sixth embodiment of a DMTJ device according to the subject matter disclosed herein;

DETAILED DESCRIPTION

Figure 3:
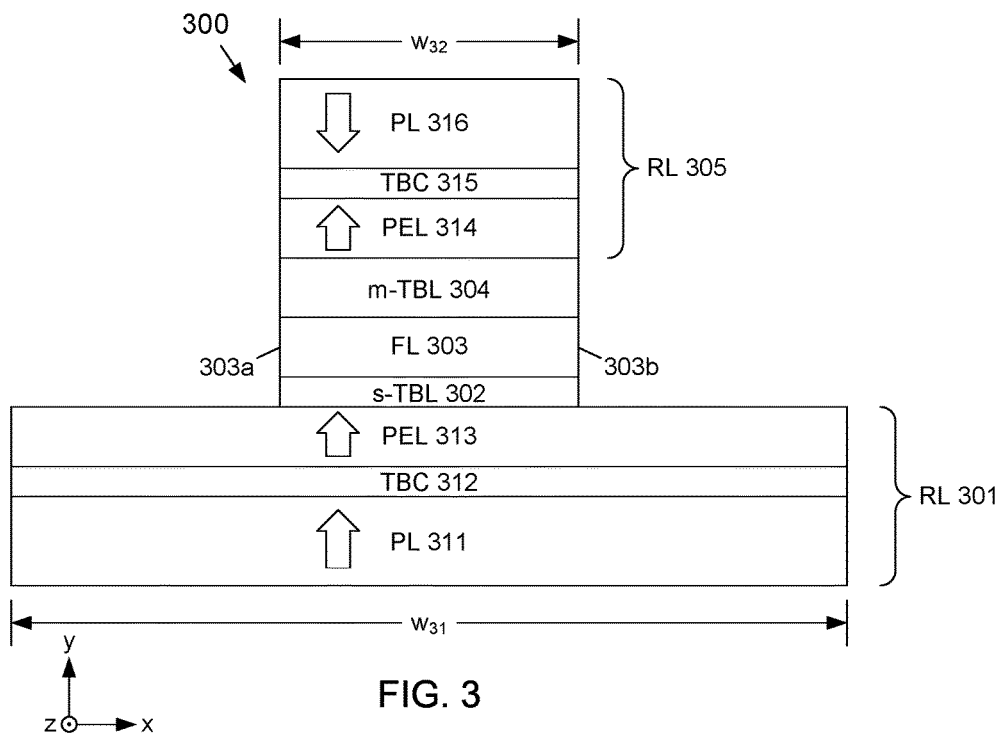
FIG. 3 depicts a cross-sectional view of a third embodiment of a DMTJ device according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment is included in at least one embodiment disclosed herein. Thus, the appearances of the phrases "in one embodiment" or "in an embodiment" or "according to one embodiment" (or other phrases having similar import) in various places throughout this specification are not necessarily all referring to the same embodiment. As used herein, the word "exemplary" means "serving as an example, instance, or illustration." Any embodiment described herein as "exemplary" is not to be construed as necessarily preferred or advantageous over other embodiments. Furthermore, the particular features, structures, or characteristics may be combined in any suitable manner in one or more embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

The exemplary embodiments described herein are described in the context of particular magnetic junctions and magnetic memories having certain components, arrangements and/or configurations. It should be understood that the subject matter disclosed herein is consistent with the use of magnetic junctions and magnetic memories having other and/or additional components and/or other features that are not inconsistent with the subject matter disclosed herein. A method and system are also disclosed in the context of current understanding of the spin-transfer phenomenon, of magnetic anisotropy, and/or of other physical phenomenon. Consequently, it should be understood that any theoretical explanations of behavior of the disclosed method and system are made based upon this current understanding of spin transfer, magnetic anisotropy and/or other physical phenomenon. The disclosed method and system described herein, however, are not dependent upon a particular physical explanation. It should also be understood that the disclosed method and system are described in the context of a structure having a particular arrangement and/or configuration. It should be understood that the method and system may be consistent with other structures. Additionally, the disclosed method and system are described in the context of certain layers being simple, multilayer and/or synthetic. It should be understood, however, that the layers may have another structure. Furthermore, the method and system are described in the context of magnetic junctions and/or substructures having particular layers. It should be understood that magnetic junctions and/or substructures having additional and/or different layers that are not inconsistent with the disclosed method and system could also be used. Moreover, certain components may be described as being magnetic, ferromagnetic, and ferrimagnetic. As used herein the term "magnetic" or "ferromagnetic" includes, but is not limited to ferromagnets and ferrimagnets. The method and system are also disclosed in the context of single magnetic junctions and substructures. It should be understood that the disclosed method and system are consistent with the use of magnetic memories having multiple magnetic junctions and using multiple substructures. Further, as used herein, the term "in-plane" is substantially within or substantially parallel to the plane of one or more of the layers of a magnetic junction. Conversely, the term "perpendicular" corresponds to to direction that is substantially perpendicular to one or more of the layers of the magnetic junction.

Embodiment 1

FIG. 1 depicts a cross-sectional view of a first embodiment of a dual magnetic tunnel junction (DMTJ) device 100 according to the subject matter disclosed herein. The DMTJ device 100 may comprise a first reference magnetic layer RL 101, a thinner sub tunnel barrier layer s-TBL 102, a free magnetic layer FL 103, a main (thicker) tunnel barrier layer m-TBL 104 and a second reference magnetic layer RL 105. The first reference magnetic layer RL 101 may comprise a first pinned magnetic layer PL 111, a first texture blocking coupling layer TBC 112 and a first polarization enhancement layer PEL 113. The second reference magnetic layer RL 105 may comprise a second polarization enhancement layer PEL 114, a second texture blocking coupling layer TBC 115 and a second magnetic pinned layer PL 116. The various layers forming the DMTJ 100 may be formed in a stack as depicted in FIG. 1.

The DMTJ device 100 may include other layers and features that are not shown in FIG. 1, such as but not limited to, a bottom electrode that may be coupled to the first pinned magnetic layer PL 111; a top electrode that may be coupled to the second pinned magnetic layer PL 116; a seed layer that may be formed between the bottom electrode and the first pinned magnetic layer PL 111; a capping layer that may be formed between the top electrode and the second pinned magnetic layer PL 116, and/or a capping layer that may be formed on the side walls of the DMTJ device 100. The DMTJ 100 may be formed on a substrate that is not shown, and the DMTJ 100 may be arranged in an array of a plurality of DMTJs. It should be understood that although the DMTJ device 100 is depicted in FIG. 1 as arranged with the first pinned magnetic layer PL 111 on the bottom and the second pinned magnetic layer PL 116 on the top, the DMTJ 100 device could be arranged with the second pinned magnetic layer PL 116 on the bottom and the first pinned magnetic layer PL 111 on the top.

The magnetization anisotropy of the DMTJ device 100 may be oriented to be substantially vertical, that is, in a direction that is substantially parallel with the y-axis depicted in FIG. 1. The magnetization direction of the first pinned magnetic layer PL 111 and the first polarization enhancement layer PEL 113 may be in a direction towards the top of FIG. 1, as depicted by the arrows in the first pinned magnetic layer PL 111 and the first polarization enhancement layer 113. The magnetization direction of the second pinned magnetic layer PL 116 and the second polarization enhancement layer PEL 114 may be anti-parallel to the magnetization direction of the first pinned magnetic layer PL 101 and the first polarization enhancement layer PEL 103, that is, in a direction towards the bottom of FIG. 1, as depicted by the arrows in the second pinned magnetic layer PL 116 and the second polarization enhancement layer PEL 114.

The first pinned magnetic layer PL 111 and the second pinned magnetic layer PL 116 may be hard reference magnetic layers. The first pinned layer PL 111 and the second pinned layer PL 116 may be formed from Co/Pt, Co/Pd, Co/Ir, Co/Ru, Co/Os, Fe/W, Co/W and/or Co/Ni multilayers in which thicknesses of the sublayers are about 0.2 nm to about 1.2 nm, and each may have a thickness in the vertical direction (i.e., along the y-axis) of between about 1.5 nm and about 15 nm. In one embodiment, either one or both of the pinned layers may be a set of different multilayers (e.g., interleaving Co/Ru and Co/Ir multilayers).

The first texture blocking coupling layer TBC 112 and the second texture blocking coupling layer TBC 115 may be formed from Ta, W, Mo, Nb, Ru, Cr, Jr, Os, Rh and/or other similar metals that show comparable magnetic and crystallographic properties, and each may have a thickness in the vertical direction of between about 0.2 nm and about 2.5 nm. The function of the texture blocking coupling layer may be to provide a crystallographic decoupling between the pinned and polarization enhancing layer (thus the lattice type or symmetry of the lattices may be different) while still providing good degree of magnetic coupling.

The first polarization enhancement layer PEL 113 and the second polarization enhancement layer PEL 114 may be formed from FeB, CoFeB, CoFeC or other similar materials that may have composition of $Co_xFe_yNi_zX(1-x-y-z)$ in which x, y and z are between 0 and 80% and X is a special glass-forming agent (GFA), which helps to achieve proper crystallization of the free layer after annealing at increased temperature (usually between about 250 C and about 550 C). Some of the typical X materials include B, Si, C, Al, Ti, V, Cr, Ga, Zr, Nb, Ta, W, Bi, Ge, Be, Mo and/or Mg, and each may have a thickness in the vertical direction of between about 0.5 nm and about 2.5 nm.

The sub tunnel barrier layer s-TBL 102 and the main tunnel barrier layer m-TBL 104 may be formed from an oxide material, such as MgO, AlO, MgAlO, MgZrO or other materials. The function of this material is to improve spin torque efficiency and effective polarization of the tunneling current. The sub tunnel barrier layer s-TBL 102 may be formed to have a thickness of between about 0.4 nm and about 1.6 nm. The main tunnel barrier layer m-TBL 104 may be formed to have a thickness in the vertical direction of about 0.5 nm and about 2.0 nm.

The free magnetic layer FL 103 may be formed from a ferromagnetic material, such as FeB, CoFeB, CoFeC or other similar materials that have composition of $Co_xFe_yNi_zX$ $(1-x-y-z)$ in which x, y and z are between 0 and 80% and X is a special glass-forming agent (GFA), which helps to achieve proper crystallization of the free layer after annealing at increased temperature (usually between about 250 C and about 550 C). Some of the typical X materials include B, Si, C, Al, Ti, V, Cr, Ga, Zr, Nb, Ta, W, Bi, Ge, Be, Mo and/or Mg, and may be formed to have a thickness in the vertical direction of about 0.5 nm to about 5.0 nm. In one embodiment, the free magnetic layer FL 103 may be formed of a multilayer including above materials.

In one example embodiment in which the shape of the DMTJ device 100 may be substantially round when viewed in a plan view, the width $w_1$ of the DMTJ device measured in a direction (the horizontal direction) that is parallel to the plane formed by the x-axis and the z-axis may be less than about 30 nm. In another example embodiment in which the shape of the DMTJ device 100 may be substantially round when viewed in a plan view, the width $w_1$ of the DMTJ device 100 measured in the horizontal direction may be less than about 25 nm. In yet another example embodiment in which the shape of the DMTJ device 100 may not be substantially round when viewed in a plan view, the width $w_1$ of the DMTJ device 100 measured from a first side of the DMTJ device 100 to the other side that is substantially directly across from the first side in the horizontal direction may be less than about 30 nm. In still another example embodiment in which the shape of the DMTJ device 100 may not be substantially round, the width $w_1$ of the DMTJ device 100 measured from a first side of the DMTJ device 100 to the other side that is substantially directly across from the first side in the horizontal direction may be less than about 25 nm.

The physical arrangement of the layers, the magnetization direction of the layers, and the width of the DMTJ device 100 provide that the in-plane magnetostatic field at the edges 103a and 103b of the free magnetic layer FL 103 resulting from the first reference magnetic layer RL 101 and the second reference magnetic layer RL 105 is substantially cancelled (i.e., less than about 500 Oe). That is, the physical arrangement, the magnetization direction, and the width of the DMTJ device 100 provide that the magnetostatic field that is associated with the first pinned magnetic layer PL 111 and the first polarization enhancement layer PEL 113 cancels the magnetostatic field that is associated with the second pinned magnetic layer PL 116 and the first polarization enhancement layer PEL 114 so that the resulting in-plane magnetostatic field at the edges 103a and 103b of the free magnetic layer FL 103 is less than about 500 Oe. The cancellation of the resulting magnetostatic field at the edges of the free magnetic layer FL 103 reduces the magnitude of the fringing field (or flowering field) at the edges of the free magnetic layer FL 103 and thereby reduces the magnitude of the switching current $J_{c0}$ for the DMTJ device 100.

Embodiment 2

FIG. 2 depicts a cross-sectional view of a second embodiment of a DMTJ device 200 according to the subject matter disclosed herein. The DMTJ device 200 may comprise a first reference magnetic layer RL 201, a sub tunnel barrier layer s-TBL 202, a free magnetic layer FL 203, a main tunnel barrier layer m-TBL 204 and a second reference magnetic layer RL 205. The first reference magnetic layer RL 201 may comprise first pinned magnetic layer PL 211, a first texture blocking coupling layer TBC 212 and a first polarization enhancement layer PEL 213. The second reference magnetic layer RL 205 may comprise a second polarization enhancement layer PEL 214, a second texture blocking coupling layer TBC 215 and a second magnetic pinned layer PL 216. The various layers forming the DMTJ 200 are formed in a stack as depicted in FIG. 2.

The DMTJ device 200 may include other layers and features that are not shown in FIG. 2, such as but not limited to, a bottom electrode that may be coupled to the first pinned magnetic layer PL 211; a top electrode that may be coupled to the second pinned magnetic layer PL 216; a seed layer that may be formed between the bottom electrode and the first pinned magnetic layer PL 211; a capping layer that may be formed between the top electrode and the second pinned magnetic layer PL 216, and/or a capping layer that may be formed on the side walls of the DMTJ device 200. The DMTJ 200 may be formed on a substrate that is not shown, and the DMTJ 200 may be arranged in an array of a plurality of DMTJs. It should be understood that although the DMTJ device 200 is depicted in FIG. 2 as arranged with the first pinned magnetic layer PL 211 on the bottom and the second pinned magnetic layer PL 216 on the top, the DMTJ 200 device could be arranged with the second pinned magnetic layer PL 216 on the bottom and the first pinned magnetic layer PL 211 on the top.

The magnetization anisotropy of the DMTJ device 200 may be oriented to be substantially vertical, that is, in a direction that is substantially parallel with the y-axis depicted in FIG. 2. The magnetization direction of the first pinned magnetic layer PL 211 and the first polarization enhancement layer PEL 213 is substantially vertical, that is, substantially parallel to the y-axis shown in FIG. 2, and antiparallel with each other as indicated by the arrows in the first pinned magnetic layer PL 211 and the first polarization enhancement layer PEL 213. The magnetization direction of the second pinned magnetic layer PL 216 and the second polarization enhancement layer PEL 214 is substantially vertical and anti-parallel with each other, as indicated by the arrow in the second pinned magnetic layer PL 216 and the second polarization enhancement layer PEL 214.

The first pinned magnetic layer PL 211 and the second pinned magnetic layer PL 216 may be hard reference magnetic layers. The first pinned magnetic layer PL 211 and the second pinned magnetic layer PL 216 may be formed from Co/Pt, Co/Pd, Co/Ir, Co/Ru, Co/Os, Fe/W, Co/W and/or Co/Ni multilayers in which thicknesses of the sublayers are about 0.2 nm to about 1.2 nm, and each may have a thickness in the vertical direction (i.e., along the y-axis) of between about 1.5 nm and about 15 nm. In one embodiment, either one or both of the pinned layers may be a set of different multilayers (e.g., interleaving Co/Ru and Co/Ir multilayers).

The first texture blocking coupling layer TBC 212 and the second texture blocking coupling layer TBC 215 may be formed from Ta, W, Mo, Nb, Ru, Cr, Jr, Os, Rh and/or other similar metals that show comparable magnetic and crystallographic properties and each may have a thickness in the vertical direction of between about 0.2 nm and about 2.5 nm.

The first polarization enhancement layer PEL 213 and the second polarization enhancement layer PEL 214 may be formed from FeB, CoFeB, CoFeC or other similar materials that have composition of $Co_xFe_yNi_zX(1-x-y-z)$ in which x, y and z are between 0 and 80% and X is a special glass-forming agent (GFA), which helps to achieve proper crystallization of the free layer after annealing at increased temperature (usually between about 250 C and about 550 C). Some of the typical X materials include B, Si, C, Al, Ti, V, Cr, Ga, Zr, Nb, Ta, W, Bi, Ge, Be, Mo and/or Mg, and each may have a thickness in the vertical direction of between about 0.5 nm and about 2.5 nm. The first polarization enhancement layer PEL 213 is anti-ferromagnetically coupled to pinned magnetic layer PL 211, and the second polarization enhancement layer PEL 207 is anti-ferromagnetically coupled to the second pinned magnetic layer PL 216.

The sub tunnel barrier layer s-TBL 204 and the main tunnel barrier layer m-TBL 206 may be formed from an oxide material, such as MgO, AlO, MgAlO, MgZrO or other materials. The function of this material may be to improve spin torque efficiency and effective polarization of the tunneling current. The sub tunnel barrier layer s-TBL 204 may be formed to have a thickness of between about 0.4 nm and about 1.6 nm. The main tunnel barrier layer m-TBL 206 may be formed to have a thickness of about 0.5 nm and about 2.0 nm.

The free magnetic layer FL 205 may be formed from a ferromagnetic material, such as FeB, CoFeB, CoFeC or other similar materials that have composition of $Co_xFe_yNi_zX$ (1-x-y-z) in which x, y and z are between 0 and 80% and X is a special glass-forming agent (GFA), which helps to achieve proper crystallization of the free layer after annealing at increased temperature (usually between about 250 C and about 550 C). Some of the typical X materials include B, Si, C, Al, Ti, V, Cr, Ga, Zr, Nb, Ta, W, Bi, Ge, Be, Mo and/or Mg, and may be formed to have a thickness in the vertical direction of about 0.5 nm to about 5.0 nm. In one embodiment, the free magnetic layer FL 205 may be formed of a multilayer including above materials.

The example embodiment of the DMTJ device 200 depicted in FIG. 2 may have a width $w_2$ that is measured in a direction (the horizontal direction) that is parallel to the plane formed by the x-axis and the z-axis that is not constrained to be less than 30 nm. In one example embodiment, the DMTJ device 200 may have a shape that when viewed in a plan view that may be substantially round. In another example embodiment, the DMTJ device 200 may have a shape that when viewed in a plan view may not be substantially round.

The physical arrangement of the layers and the magnetization direction of the layers of the DMTJ device 200 provide that the in-plane magnetostatic field at the edges 203a and 203b of the free magnetic layer FL 203 resulting from the first reference magnetic layer RL 201 and from the second reference magnetic layer RL 205 is substantially cancelled to be less than about 500 Oe. That is, the physical arrangement and the magnetization direction of the layers of the DMTJ device 200 provide that the magnetostatic field that is associated with the first pinned magnetic layer PL 211 and the first polarization enhancement layer PEL 213 cancels the magnetostatic field that is associated with the second pinned magnetic layer PL 216 and the first polarization enhancement layer PEL 214 so that the resulting in-plane magnetostatic field at the edges 203a and 203b of the free magnetic layer FL 203 is less than about 500 Oe. The cancellation of the resulting magnetostatic field reduces the magnitude of the fringing field (or flowering field) at the edges of the free magnetic layer FL 203, and thereby reduces the switching current $J_{c0}$ of the DMTJ device 200.

Embodiment 3

FIG. 3 depicts a cross-sectional view of a third embodiment of a DMTJ device 300 according to the subject matter disclosed herein. The DMTJ device 300 may comprise a first reference magnetic layer RL 301, a sub tunnel barrier layer s-TBL 302, a free magnetic layer 303, a main tunnel barrier layer m-TBL 304 and a second reference magnetic layer RL 305. The first reference magnetic layer RL 301 may comprise a first pinned magnetic layer PL 311, a first texture blocking coupling layer TBC 312 and a first polarization enhancement layer PEL 313. The second reference magnetic layer RL 305 may comprise a second polarization enhancement layer PEL 314, a second texture blocking coupling layer TBC 315, and a second magnetic pinned layer PL 316. The various layers forming the DMTJ 300 may be formed in a stack as depicted in FIG. 3.

The DMTJ device 300 may include other layers and features that are not shown in FIG. 3, such as but not limited to, a bottom electrode that may be coupled to the first pinned magnetic layer PL 311; a top electrode that may be coupled to the second pinned magnetic layer PL 316; a seed layer that may be formed between the bottom electrode and the first pinned magnetic layer PL 311; a capping layer that may be formed between the top electrode and the second pinned magnetic layer PL 316, and/or a capping layer that may be formed on the side walls of the DMTJ device 300. The DMTJ 300 may be formed on a substrate that is not shown, and the DMTJ 300 may be arranged in an array of a plurality of DMTJs. It should be understood that although the DMTJ device 300 is depicted in FIG. 3 as arranged with the first pinned magnetic layer PL 311 on the bottom and the second pinned magnetic layer PL 316 on the top, the DMTJ 300 device could be arranged with the second pinned magnetic layer PL 316 on the bottom and the first pinned magnetic layer PL 311 on the top.

The magnetization anisotropy of the DMTJ device 300 may be oriented to be substantially vertical, that is, in a direction that is substantially parallel with the y-axis depicted in FIG. 3. The magnetization direction of the first pinned magnetic layer PL 311 and the first polarization enhancement layer PEL 313 may be substantially vertical, that is, in a direction towards the top of FIG. 3 as indicated by the arrows in the first pinned magnetic layer PL 311 and the first polarization enhancement layer PEL 313. The magnetization direction of the second pinned magnetic layer PL 316 and the second polarization enhancement layer PEL 314 may substantially vertical, and be anti-ferromagnetically coupled to each other, as indicated by the arrows in the second pinned magnetic layer 216 and the second polarization enhancement layer PEL 314.

The first pinned magnetic layer PL 311 and the second pinned magnetic layer PL 316 may be hard reference magnetic layers. The layers PL 311 and PL 316 may be formed from Co/, Co/Pd, Co/Ir, Co/Ru, Co/Os, Fe/W, Co/W and/or Co/Ni multilayers in which thicknesses of the sublayers are about 0.2 nm to about 1.2 nm, and each may have a thickness in the vertical direction (i.e., along the y-axis) of between about 1.5 nm and about 15 nm. In one embodiment, either one or both of the pinned layers may be a set of different multilayers (e.g., interleaving Co/Ru and Co/Ir multilayers).

The first texture blocking coupling layer TBC 312 and the second texture blocking coupling layer TBC 315 may be formed from Ta, W, Mo, Nb, Ru, Cr, Ir, Os, Rh and/or other similar metals that show comparable magnetic and crystallographic properties, and each may have a thickness in the vertical direction of between about 0.2 nm and about 2.5 nm. The function of the texture blocking coupling layer may be to provide a crystallographic decoupling between the pinned and polarization enhancing layer (thus the lattice type or symmetry of the lattices may be different) while still providing good degree of magnetic coupling.

The first polarization enhancement layer PEL 313 and the second polarization enhancement layer PEL 314 may be formed from FeB, CoFeB, CoFeC or other similar materials that have composition of $Co_xFe_yNi_zX(1-x-y-z)$ in which x, y and z are between 0 and 80% and X is a special glass-forming agent (GFA), which helps to achieve proper crystallization of the free layer after annealing at increased temperature (usually between 250 C and 550 C). Some of the typical X materials include B, Si, C, Al, Ti, V, Cr, Ga, Zr, Nb, Ta, W, Bi, Ge, Be, Mo and/or Mg, and each may have a thickness in the vertical direction of between about 0.5 nm and about 2.5 nm.

The sub tunnel barrier layer s-TBL 302 and the main tunnel barrier layer m-TBL 304 may be formed from an oxide material, such as MgO, AlO, MgAlO, MgZrO or other materials. The function of this material is to improve spin torque efficiency and effective polarization of the tunneling current. The sub tunnel barrier layer s-TBL 302 may be formed to have a thickness of between about 0.4 nm and about 1.6 nm. The main tunnel barrier layer m-TBL 304 may be formed to have a thickness in the vertical direction of about 0.5 nm and about 2.0 nm.

The free magnetic layer FL 303 may be formed from a ferromagnetic material, such as FeB, CoFeB, CoFeC or other similar materials that have composition of $Co_xFe_yNi_zX$ (1-x-y-z) in which x, y and z are between 0 and 80% and X is a special glass-forming agent (GFA), which helps to achieve proper crystallization of the free layer after annealing at increased temperature (usually between about 250 C and about 550 C). Some of the typical X materials include B, Si, C, Al, Ti, V, Cr, Ga, Zr, Nb, Ta, W, Bi, Ge, Be, Mo and/or Mg, and may be formed to have a thickness in the vertical direction of about 0.5 nm to about 5.0 nm. In one embodiment, the free magnetic layer FL 303 may be formed of a multilayer including above materials.

In one example embodiment, the first pinned magnetic layer 311, the first texture blocking coupling layer 312 and the polarization enhancement layer 313 of the DMTJ device 300 may have a width $w_{31}$ that is measured in a direction (the horizontal direction) that is parallel to a plane formed by the x-axis and the z-axis in FIG. 3 that is at least three times greater than a width $w_{32}$ of the sub tunnel barrier layer s-TBL 302, the free magnetic layer 303, the main tunnel barrier layer m-TBL 304, the second polarization enhancement layer PEL 314, the second texture blocking coupling layer TBC 315, and the second magnetic pinned layer PL 316. The width $w_{32}$ is measured in the horizontal direction.

The physical arrangement of the layers and the magnetization direction of the layers of the DMTJ device 300 provide that the in-plane magnetostatic field resulting from the first reference magnetic layer RL 301 (i.e., first pinned magnetic layer PL 311 and the first polarization enhancement layer PEL 313) and from the second reference magnetic layer RL 305 (i.e., the second pinned magnetic layer PL 316 and the anti-ferromagnetically coupled second polarization enhancement layer PEL 314) is substantially cancelled to be less than about 500 Oe at the edges 303a and 303b of the free magnetic layer FL 303. Even though the first pinned magnetic layer 311 and the first polarization enhancement layer PEL 313 both have a magnetization direction that may be substantially vertical, the physical distance of the edges of the first pinned magnetic layer 311 and the first polarization enhancement layer PEL 313 and the magnetostatic field formed at the edges of the first pinned magnetic layer 311 and the first polarization enhancement layer PEL 313 from the edges of the free magnetic layer FL 303 in combination with the magnetostatic field formed by the second pinned magnetic layer 316 and the second polarization enhancement layer PEL 314 results in an in-plane magnetostatic field at the edges of the free magnetic layer 303 that is less than about 500 Oe. The cancellation of the resulting magnetostatic field at the edges of the free magnetic layer FL 303 reduces the switching current $J_{c0}$ of the DMTJ device 300.

Embodiment 4

Figure 4:
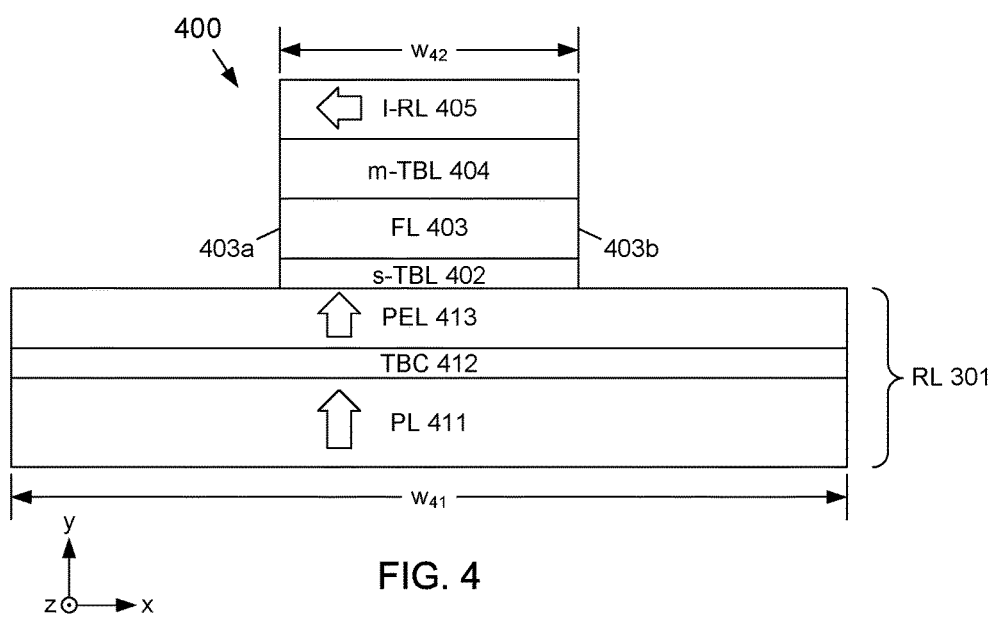
FIG. 4 depicts a cross-sectional view of a fourth embodiment of a DMTJ device according to the subject matter disclosed herein.

FIG. 4 depicts a cross-sectional view of a fourth embodiment of a DMTJ device 400 according to the subject matter disclosed herein. The DMTJ device 400 may comprise a first reference magnetic layer RL 401, a sub tunnel barrier layer s-TBL 402, a free magnetic layer 403, a main tunnel barrier layer m-TBL 404 and a self-initializing magnetic layer I-RL 405. The first reference magnetic layer RL 401 may comprise a first pinned magnetic layer PL 411, a first texture blocking coupling layer TBC 412 and a first polarization enhancement layer PEL 413. The various layers forming the DMTJ 400 may be formed in a stack as depicted in FIG. 4.

The DMTJ device 400 may include other layers and features that are not shown in FIG. 4, such as but not limited to, a bottom electrode that may be coupled to the first pinned magnetic layer 411; a top electrode that may be coupled to the self-initializing magnetic layer I-RL 405; a seed layer that may be formed between the bottom electrode and the first pinned magnetic layer PL 411; a capping layer that may be formed between the top electrode and the self-initializing magnetic layer I-RL 405, and/or a capping layer that may be formed on the side walls of the DMTJ device 400. The DMTJ 400 may be formed on a substrate that is not shown, and the DMTJ 400 may be arranged in an array of a plurality of DMTJs. It should be understood that although the DMTJ device 400 is depicted in FIG. 4 as arranged with the first pinned magnetic layer PL 411 on the bottom and the self-initializing magnetic layer I-RL 405 on the top, the DMTJ 400 device could be arranged with the self-initializing magnetic layer I-RL 405 on the bottom and the first pinned magnetic layer PL 411 on the top.

The magnetization anisotropy of the first pinned magnetic layer PL 411 and the first polarization enhancement layer PEL 413 may be oriented to be substantially vertical, that is, in a direction that is substantially parallel with the y-axis depicted in FIG. 4 and towards the top of FIG. 4 as indicated by the arrows in the first pinned magnetic layer PL 411 and the first polarization enhancement layer PEL 413. The magnetization direction of the self-initialized magnetic layer I-RL 405 is horizontal (i.e., in the direction parallel to a plane formed by the x-axis and the z-axis, and indicated by the arrow in the self-initialized layer I-RL 405) if no spin torque is applied to the self-initialized magnetic layer I-RL 405. In the presence of spin torque, the magnetization direction of the self-initialized magnetic layer 405 becomes vertical and opposite to the magnetization direction of the first pinned magnetic layer PL 411 and the first polarization enhancement layer PEL 413.

The first pinned magnetic layer PL 411 may be a hard reference magnetic layer. The layer PL 411 may be formed from Co/Pt, Co/Pd, Co/Ir, Co/Ru, Co/Os, Fe/W, Co/W and/or Co/Ni multilayers in which thicknesses of the sub-layers are about 0.2 nm to about 1.2 nm, and may have a thickness in the vertical direction (i.e., along the y-axis) of between about 1.5 nm and about 15 nm. In one embodiment, either one or both of the pinned layers may be a set of different multilayers (e.g., interleaving Co/Ru and Co/Ir multilayers).

The first texture blocking coupling layer TBC 412 may be formed from Ta, W, Mo, Nb, Ru, Cr, Jr, Os, Rh and/or other similar metals that show comparable magnetic and crystallographic properties and may have a thickness in the vertical direction of between about 0.2 nm and about 2.5 nm.

The first polarization enhancement layer PEL 413 may be formed from FeB, CoFeB, CoFeC or other similar materials that have composition of $Co_xFe_yNi_zX(1-x-y-z)$ in which x, y and z are between 0 and 80% and X is a special glass-forming agent (GFA), which helps to achieve proper crystallization of the free layer after annealing at increased temperature (usually between about 250 C and about 550 C). Some of the typical X materials include B, Si, C, Al, Ti, V, Cr, Ga, Zr, Nb, Ta, W, Bi, Ge, Be, Mo and/or Mg, and may have a thickness in the vertical direction of between about 0.5 nm and about 2.5 nm.

The sub tunnel barrier layer s-TBL 402 and the main tunnel barrier layer m-TBL 404 may be formed from an oxide material, such as MgO, AlO, MgAlO, MgZrO or other materials. The function of this material may be to improve spin torque efficiency and effective polarization of the tunneling current. The sub tunnel barrier layer s-TBL 402 may be formed to have a thickness of between about 0.4 nm and about 1.6 nm. The main tunnel barrier layer m-TBL 404 may be formed to have a thickness in the vertical direction of about 0.5 nm and about 2.0 nm.

The free magnetic layer FL 403 may be formed from a ferromagnetic material, such as FeB, CoFeB, CoFeC or other similar materials that have composition of $Co_xFe_yNi_zX$ (1-x-y-z) in which x, y and z are between 0 and 80% and X is a special glass-forming agent (GFA), which helps to achieve proper crystallization of the free layer after annealing at increased temperature (usually between about 250 C and about 550 C). Some of the typical X materials include B, Si, C, Al, Ti, V, Cr, Ga, Zr, Nb, Ta, W, Bi, Ge, Be, Mo and/or Mg, and may be formed to have a thickness in the vertical direction of about 0.5 nm to about 5.0 nm. In one embodiment, the free magnetic layer FL 405 may be formed of a multilayer including above materials.

The self-initializing magnetic layer I-RL 405 may be formed from FeB, CoFeB, CoFeC or other similar materials that have composition of $Co_xFe_yNi_zX(1-x-y-z)$ in which x, y and z are between 0 and 80% and X is a special glass-forming agent (GFA), which helps to achieve proper crystallization of the free layer after annealing at increased temperature (usually between about 250 C and about 550 C). Some of the typical X materials include B, Si, C, Al, Ti, V, Cr, Ga, Zr, Nb, Ta, W, Bi, Ge, Be, Mo and/or Mg, and may have a thickness in the vertical direction of between about 0.5 nm and about 2.5 nm.

In one example embodiment, the first pinned magnetic layer 411, the first texture blocking coupling layer 412 and the polarization enhancement layer 413 of the DMTJ device 400 may have a width $w_{41}$ that is measured in a direction (the horizontal direction) that is parallel to a plane formed by the x-axis and the z-axis in FIG. 4 and that is at least three times greater than a width $w_{42}$ of the sub tunnel barrier layer s-TBL 402, the free magnetic layer 403, the main tunnel barrier layer m-TBL 404 and the self-initializing magnetic layer I-RL 405. The width $w_{41}$ is measured in the horizontal direction.

The physical arrangement of the layers and the magnetization direction of the layers of the DMTJ device 400 provide that the in-plane magnetostatic field resulting from first pinned magnetic layer PL 411 and the first polarization enhancement layer PEL 413 is substantially cancelled to be less than about 500 Oe at the edges of the free magnetic layer FL 405. The physical distance of the edges of the first pinned magnetic layer 411 and the first polarization enhancement layer PEL 413 and the magnetostatic field formed at the edges of the first pinned magnetic layer 411 and the first polarization enhancement layer PEL 413 from the edges 403a and 403b of the free magnetic layer FL 403 in combination with the magnetostatic field formed by the self-initializing magnetic layer I-RL 405 results in an in-plane magnetostatic field at the edges of the free magnetic layer 403 that is less than 500 Oe. The cancellation of the resulting magnetostatic field at the edges of the free magnetic layer FL 403 reduces the switching current $J_{co}$ of the DMTJ device 400.

Embodiment 5

FIG. 5 depicts a cross-sectional view of a fifth embodiment of a DMTJ device 500 according to the subject matter disclosed herein. The DMTJ device 500 may comprise a first reference magnetic layer RL 501, a sub tunnel barrier layer s-TBL 502, a free magnetic layer FL 503, a main tunnel barrier layer m-TBL 504 and a second reference magnetic layer RL 505. The first reference magnetic layer RL 501 may comprise a first pinned ferrimagnetic layer PL 511, a first texture blocking coupling layer TBC 512 and a first polarization enhancement layer PEL 513. The second reference magnetic layer RL 505 may comprise a second polarization enhancement layer PEL 514, a second texture blocking coupling layer TBC 515 and a second ferrimagnetic pinned layer PL 516. The various layers forming the DMTJ 500 may be formed in a stack as depicted in FIG. 5.

The DMTJ device 500 may include other layers and features that are not shown in FIG. 5, such as but not limited to, a bottom electrode that may be coupled to the first pinned ferrimagnetic layer PL 511; a top electrode that may be coupled to the second pinned ferrimagnetic layer PL 516; a seed layer that may be formed between the bottom electrode and the first pinned ferrimagnetic layer PL 511; a capping layer that may be formed between the top electrode and the second pinned ferrimagnetic layer PL 516, and/or a capping layer that may be formed on the side walls of the DMTJ device 500. The DMTJ 500 may be formed on a substrate that is not shown, and the DMTJ 500 may be arranged in an array of a plurality of DMTJs. It should be understood that although the DMTJ device 500 is depicted in FIG. 5 as arranged with the first pinned ferrimagnetic layer PL 511 on the bottom and the second pinned ferrimagnetic layer PL 516 on the top, the DMTJ 500 device could be arranged with the second pinned ferrimagnetic layer PL 526 on the bottom and the first pinned ferrimagnetic layer PL 511 on the top.

The magnetization anisotropy of the DMTJ device 500 may be oriented to be substantially vertical, that is, in a direction that is substantially parallel with the y-axis depicted in FIG. 5. The magnetization direction of the first pinned ferrimagnetic layer PL 511 and the first polarization enhancement layer PEL 513 may be substantially vertical, that is, in a direction towards the top of FIG. 5 as indicated by the smaller arrows in the first pinned ferrimagnetic layer PL 511 and the first polarization enhancement layer PEL 513. The first pinned ferrimagnetic layer PL 511 is uncompensated and the total magnetic moment is opposite from the magnetic moment of the first polarization enhancement layer PEL 513, as indicated by the larger arrow in the first pinned ferrimagnetic layer PL 511. The magnetization direction of the second pinned ferrimagnetic magnetic layer PL 516 and the second polarization enhancement layer PEL 514 may be anti-parallel to the magnetization direction of the first pinned ferrimagnetic layer PL 511 and the first polarization enhancement layer PEL 513, that is, in a direction towards the bottom of FIG. 5, as indicated by the smaller arrows in the second pinned ferrimagnetic layer PL 516 and the second polarization enhancement layer PEL 514. The second pinned ferrimagnetic magnetic layer PL 516 is uncompensated and the total magnetic moment is opposite from the magnetic moment of the second polarization enhancement layer PEL 514, as indicated by the larger arrow in the second pinned ferrimagnetic layer PL 516.

The first pinned ferrimagnetic layer PL 511 and the second pinned ferrimagnetic layer PL 516 may be formed from Heusler materials or alloys, such as, but not limited to $X_2YZ$ in which X is one of Li, Mg, Mn, Fe, Co, Ni, Cu, Ru, Rh, Pd, Ag, Cd, Jr, Pt, Au, Y is one of Li, Be, Sc, Ti, V, Cr, Mn, Fe, Co, Ni, Zn, Y, Zr, Nb, Mo, Hf, W, La, Ce, Pr, Nd, Sm, Gd, Tb, Dy, Ho, Er, Tm, Yb, Lu and Z is one of Mg, B, Al, Si, Zn, Ga, Ge, As, In, Sn, Sb, Pb, Bi, and may also be formed from multilayers. Two examples of a Heulser material include $Mn_3Ge$, $Mn_3Ga$. The first pinned ferrimagnetic layer PL 511 and the second pinned ferrimagnetic layer 516 may each have a thickness in the vertical direction (i.e., along the y-axis) of between about 0.2 nm and about 1.2 nm.

The first texture blocking coupling layer TBC 512 and the second texture blocking coupling layer TBC 515 may be formed from Ta, W, Mo, Nb, Ru, Cr, Jr, Os, Rh and/or other similar metals that show comparable magnetic and crystallographic properties and each may have a thickness in the vertical direction of between about 0.2 nm and about 2.5 nm.

The first polarization enhancement layer PEL 513 and the second polarization enhancement layer PEL 514 may be formed from FeB, CoFeB, CoFeC or other similar materials that have composition of $Co_xFe_yNi_zX(1-x-y-z)$ in which x, y and z are between 0 and 80% and X is a special glass-forming agent (GFA), which helps to achieve proper crystallization of the free layer after annealing at increased temperature (usually between about 250 C and about 550 C). Some of the typical X materials include B, Si, C, Al, Ti, V, Cr, Ga, Zr, Nb, Ta, W, Bi, Ge, Be, Mo and/or Mg, and each may have a thickness in the vertical direction of between about 0.5 nm and about 2.5 nm.

The sub tunnel barrier layer s-TBL 502 and the main tunnel barrier layer m-TBL 504 may be formed from an oxide material, such as MgO, AlO, MgAlO, MgZrO or other materials. The function of this material may be to improve spin torque efficiency and effective polarization of the tunneling current. The sub tunnel barrier layer s-TBL 502 may be formed to have a thickness of between about 0.4 nm and about 1.6 nm. The main tunnel barrier layer m-TBL 504 may be formed to have a thickness in the vertical direction of about 0.5 nm and about 2.0 nm.

The free magnetic layer FL 503 may be formed from a ferromagnetic material, such as FeB, CoFeB, or other similar materials that have composition of $Co_xFe_yNi_zX(1-x-y-z)$ in which x, y and z are between 0 and 80% and X is a special glass-forming agent (GFA), which helps to achieve proper crystallization of the free layer after annealing at increased temperature (usually between about 250 C and about 550 C). Some of the typical X materials include B, Si, C, Al, Ti, V, Cr, Ga, Zr, Nb, Ta, W, Bi, Ge, Be, Mo and/or Mg, and may be formed to have a thickness in the vertical direction of about 0.5 nm to about 5.0 nm. The free magnetic layer FL 503 may be formed of a multilayer including above materials.

In one example embodiment in which the shape of the DMTJ device 500 may be substantially round when viewed in a plan view, the width $w_5$ of the DMTJ device measured in a direction (the horizontal direction) that is parallel to the plane formed by the x-axis and the z-axis may be less than about 30 nm. In another example embodiment in which the shape of the DMTJ device 500 may be substantially round when viewed in a plan view, the width $w_5$ of the DMTJ device 500 measured in the horizontal direction may be less than about 30 nm. In yet another example embodiment in which the shape of the DMTJ device 500 may not be substantially round, the width $w_5$ of the DMTJ device 500 measured from a first side of the DMTJ device 500 to the other side that is substantially directly across from the first side and measured in the horizontal direction may be less than about 30 nm. In still another example embodiment in which the shape of the DMTJ device 500 may not be substantially round, the width $w_5$ of the DMTJ device 500 measured from a first side of the DMTJ device 500 to the other side that is substantially directly across from the first side in the horizontal direction may be less than about 30 nm.

The physical arrangement of the layers, the magnetization direction of the layers, and the width of the DMTJ device 500 provide that the magnetostatic field at the edges 503a and 503b of the free magnetic layer FL 503 resulting from the first reference magnetic layer RL 501 and the second reference magnetic layer RF 505 is substantially cancelled (i.e., less than about 500 Oe). That is, the physical arrangement, the magnetization direction, and the width of the DMTJ device 500 provide that the magnetostatic field that is associated with the first pinned ferrimagnetic layer PL 511 and the first polarization enhancement layer PEL 513 cancels the magnetostatic field that is associated with the second pinned magnetic layer PL 516 and the first polarization enhancement layer PEL 514 so that the resulting in-plane magnetostatic field at the edges 503a and 503b of the free magnetic layer FL 503 is less than about 500 Oe. The cancellation of the resulting magnetostatic field reduces the magnitude of the fringing field (or flowering field) at the edges of the free magnetic layer FL 503 and thereby reduces the magnitude of the switching current $J_{c0}$ for the DMTJ device 500.

Embodiment 6

FIG. 6 depicts a cross-sectional view of a sixth embodiment of a DMTJ device 600 according to the subject matter disclosed herein. The DMTJ device 600 may comprise a first reference magnetic layer RL 601, a sub tunnel barrier layer s-TBL 602, a free magnetic layer FL 603, a main tunnel barrier layer m-TBL 604 and a second reference magnetic layer RL 605. The first reference magnetic layer RL 601 may comprise a first pinned ferrimagnetic layer PL 611, and the second reference magnetic layer RL 605 may comprise a second ferrimagnetic pinned layer PL 616. The various layers forming the DMTJ 600 may be formed in a stack as depicted in FIG. 6.

The DMTJ device 600 may include other layers and features that are not shown in FIG. 6, such as but not limited to, a bottom electrode that may be coupled to the first pinned ferrimagnetic layer PL 611; a top electrode that may be coupled to the second pinned ferrimagnetic layer PL 616; a seed layer that may be formed between the bottom electrode and the first pinned ferrimagnetic layer PL 611; a capping layer that may be formed between the top electrode and the second pinned ferrimagnetic layer PL 616, and/or a capping layer that may be formed on the side walls of the DMTJ device 600. The DMTJ 600 may be formed on a substrate that is not shown, and the DMTJ 600 may be arranged in an array of a plurality of DMTJs. It should be understood that although the DMTJ device 600 is depicted in FIG. 6 as arranged with the first pinned ferrimagnetic layer PL 611 on the bottom and the second pinned ferrimagnetic layer PL 616 on the top, the DMTJ 600 device could be arranged with the second pinned ferrimagnetic layer PL 616 on the bottom and the first pinned ferrimagnetic layer PL 611 on the top.

The magnetization anisotropy of the DMTJ device 600 may be oriented to be substantially vertical, that is, in a direction that is substantially parallel with the y-axis depicted in FIG. 6. The magnetization direction of the first pinned ferrimagnetic layer PL 611 may be substantially vertical, that is, in a direction towards the top of FIG. 6 as indicated by the larger arrow in the first pinned ferrimagnetic layer PL 611. The magnetization direction of the second pinned ferrimagnetic layer PL 605 is substantially vertical and in an opposite direction from the magnetization direction of the first pinned ferrimagnetic layer PL 611 as indicated by the larger arrow in the second pinned ferrimagnetic layer PL 616. The first pinned ferrimagnetic magnetic layer PL 611 and the second pinned ferrimagnetic layer 616 are each almost compensated (as indicated by the smaller arrows in the first and second pinned ferrimagnetic layers PL 611 and PL 616) so that the saturation magnetization $M_s$ for the layer is between about 50 μemu/cc² to about 200 μemu/cc².

The first pinned ferrimagnetic layer PL 611 and the second pinned ferrimagnetic layer PL 616 may be formed from Heusler materials or alloys, such as, but not limited to $X_2YZ$ in which X is one of Li, Mg, Mn, Fe, Co, Ni, Cu, Ru, Rh, Pd, Ag, Cd, Jr, Pt, Au, Y is one of Li, Be, Sc, Ti, V, Cr, Mn, Fe, Co, Ni, Zn, Y, Zr, Nb, Mo, Hf, W, La, Ce, Pr, Nd, Sm, Gd, Tb, Dy, Ho, Er, Tm, Yb, Lu and Z is one of Mg, B, Al, Si, Zn, Ga, Ge, As, In, Sn, Sb, Pb, Bi, and may also be formed from multilayers. Two examples of a Heulser material include $Mn_3Ge$, $Mn_3Ga$. The first pinned ferrimagnetic layer PL 611 and the second pinned ferrimagnetic layer 616 each may have a thickness in the vertical direction (i.e., along the y-axis) of between about 1.5 nm and about 15 nm.

The sub tunnel barrier layer s-TBL 602 and the main tunnel barrier layer m-TBL 604 may be formed from an oxide material, such as MgO, AlO, MgAlO, MgZrO or other materials. The function of this material may be to improve spin torque efficiency and effective polarization of the tunneling current. The sub tunnel barrier layer s-TBL 602 may be formed to have a thickness of between about 0.4 nm and about 1.6 nm. The main tunnel barrier layer m-TBL 604 may be formed to have a thickness in the vertical direction of about 0.5 nm and about 2.0 nm.

The free magnetic layer FL 603 may be formed from a ferromagnetic material, such as FeB, CoFeB, CoFeC or other similar materials that have composition of $Co_xFe_yNi_zX$ (1-x-y-z) in which x, y and z are between 0 and 80% and X is a special glass-forming agent (GFA), which helps to achieve proper crystallization of the free layer after annealing at increased temperature (usually between about 250 C and about 550 C). Some of the typical X materials include B, Si, C, Al, Ti, V, Cr, Ga, Zr, Nb, Ta, W, Bi, Ge, Be, Mo and/or Mg, and may be formed to have a thickness in the vertical direction of about 0.5 nm to about 5.0 nm. The free magnetic layer FL 603 may be formed of a multilayer including above materials.

In one example embodiment in which the shape of the DMTJ device 600 may be substantially round when viewed in a plan view, the width $w_6$ of the DMTJ device measured in a direction that is parallel to the plane formed by the x-axis and the z-axis may be less than about 30 nm. In another example embodiment in which the shape of the DMTJ device 600 may be substantially round when viewed in a plan view, the width $w_6$ of the DMTJ device 600 measured in the horizontal direction may be less than about 30 nm. In yet another example embodiment in which the shape of the DMTJ device 600 may not be substantially round, the width $w_6$ of the DMTJ device 600 measured from a first side of the DMTJ device 600 to the other side that is substantially directly across from the first side in the horizontal direction that is parallel to the plane formed by the x-axis and the z-axis may be less than about 30 nm. In still another example embodiment in which the shape of the DMTJ device 600 may not be substantially round, the width $w_6$ of the DMTJ device 600 measured from a first side of the DMTJ device 600 to the other side that is substantially directly across from the first side in the horizontal direction may be less than about 30 nm.

The physical arrangement of the layers, the magnetization direction of the layers, and the width of the DMTJ device 600 provide that the in-plane magnetostatic field at the edges 603a and 603b of the free magnetic layer FL 603 resulting from the first pinned ferrimagnetic layer PL 601 and the second pinned ferrimagnetic layer PL 605 is substantially cancelled (i.e., less than about 500 Oe). That is, the physical arrangement, the magnetization direction, and the width of the DMTJ device 600 provide that the magnetostatic field that is associated with the first pinned ferrimagnetic layer PL 611 cancels the magnetostatic field that is associated with the second pinned ferrimagnetic layer PL 616 so that the resulting in-plane magnetostatic field at the edges 603a and 603b of the free magnetic layer FL 603 is less than about 500 Oe. The cancellation of the resulting in-plane magnetostatic field at the edges of the free magnetic layer 603 reduces the magnitude of the fringing field (or flowering field) at the edges of the free magnetic layer FL 603 and thereby reduces the magnitude of the switching current $J_{c0}$ for the DMTJ device 600.

Figure 7:
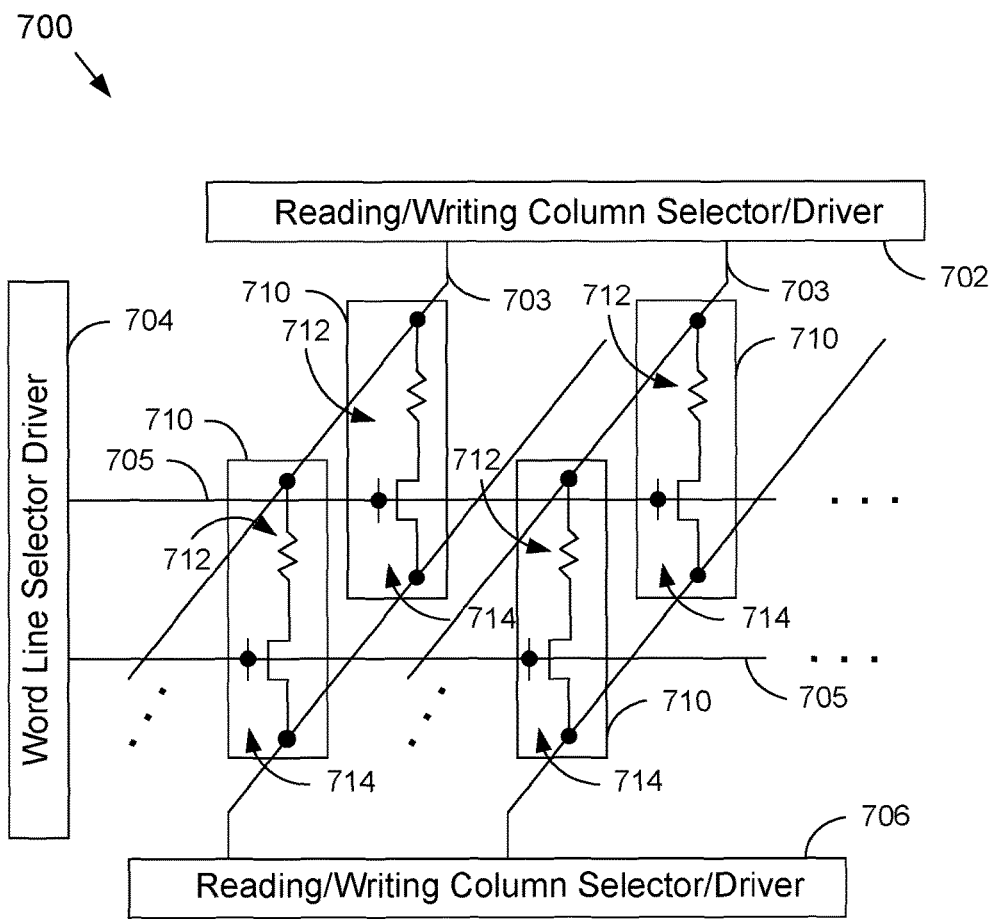
FIG. 7 depicts an exemplary embodiment of a magnetic memory that includes a DMTJ device comprising according to the subject matter disclosed herein.

FIG. 7 depicts an exemplary embodiment of a magnetic memory 700 that includes a DMTJ device comprising according to the subject matter disclosed herein. The magnetic memory 700 includes reading/writing column select drivers 702 and 706 and a word line select driver 704. It should be understood that other and/or different components may be provided that are not shown. A storage region of the memory 700 includes a plurality of magnetic storage cells 710 arranged in an array of rows and columns. Each magnetic storage cell 710 includes at least one magnetic junction device 712 and at least one selection device 714. In some embodiments, the selection device 714 is a transistor. The magnetic junction devices 712 may be configured like any of the example embodiments disclosed herein. Although one magnetic junction device 712 is shown per cell 710, in other embodiments, a different number of magnetic junction devices 712 may be provided per cell. As such, the magnetic memory 700 may enjoy the benefits described above.

Figure 8:
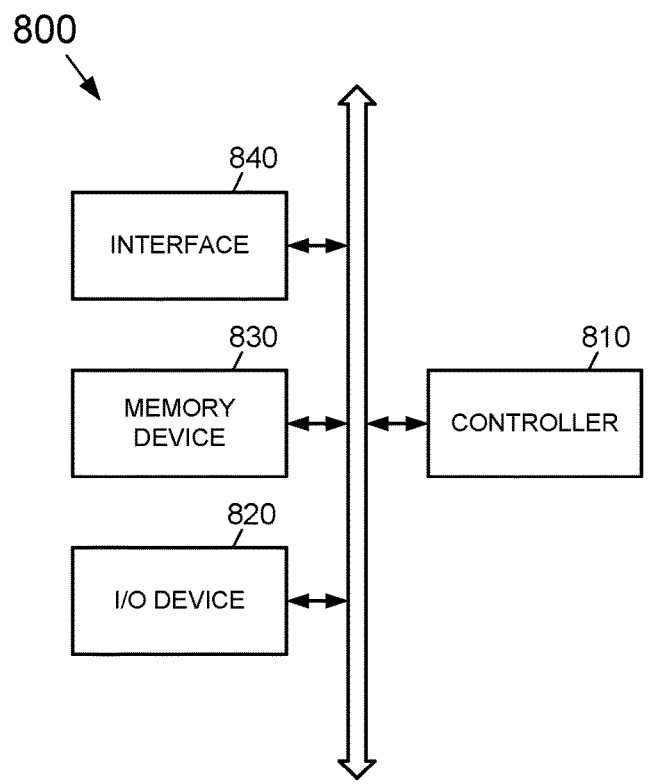
FIG. 8 depicts an electronic device that comprises one or more integrated circuits (chips) comprising a DMTJ device according to the subject matter disclosed herein.

FIG. 8 depicts an electronic device 800 that comprises one or more integrated circuits (chips) comprising a DMTJ device according to the subject matter disclosed herein. Electronic device 800 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 800 may comprise a controller 810, an input/output device 820 such as, but not limited to, a keypad, a keyboard, a display, or a touch-screen display, a memory 830, and a wireless interface 840 that are coupled to each other through a bus 850. The controller 810 may comprise, for example, at least one microprocessor, at least one digital signal process, at least one microcontroller, or the like. The memory 830 may be configured to store a command code to be used by the controller 810 or a user data. Electronic device 800 and the various system components comprising electronic device 800 may comprise a DMTJ device according to the subject matter disclosed herein. The electronic device 800 may use a wireless interface 840 configured to transmit data to or receive data from a wireless communication network using a RF signal. The wireless interface 840 may include, for example, an antenna, a wireless transceiver and so on. The electronic system 800 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Figure 9:
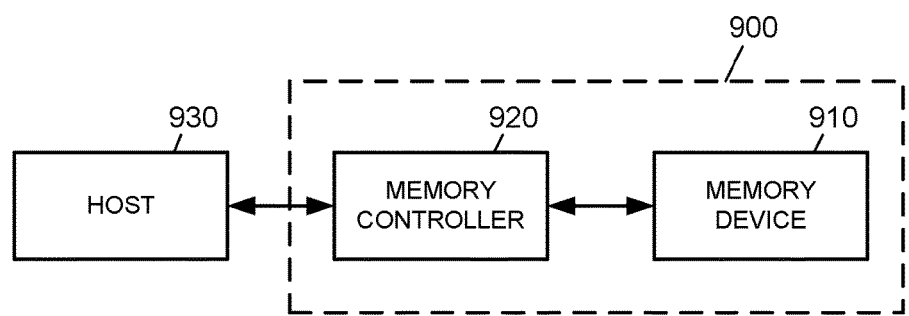
FIG. 9 depicts a memory system that may comprise a DMTJ device according to the subject matter disclosed herein.

FIG. 9 depicts a memory system 900 that may comprise a DMTJ device according to the subject matter disclosed herein. The memory system 900 may comprise a memory device 910 for storing large amounts of data and a memory controller 920. The memory controller 920 controls the memory device 910 to read data stored in the memory device 910 or to write data into the memory device 910 in response to a read/write request of a host 930. The memory controller 920 may include an address-mapping table for mapping an address provided from the host 930 (e.g., a mobile device or a computer system) into a physical address of the memory device 910. The memory device 910 may comprise one or more semiconductor devices comprising a DMTJ device according to the subject matter disclosed herein.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. A magnetic memory device, comprising:
a first reference magnetic layer;
a first tunnel barrier layer on the first reference magnetic layer;
a second tunnel barrier layer;
a free magnetic layer disposed between the first tunnel barrier layer and the second tunnel barrier layer; and
a second reference magnetic layer on the second tunnel barrier layer,
wherein the first reference magnetic layer, the first tunnel barrier layer, the free magnetic layer, the second tunnel barrier layer and the second reference magnetic layer are arranged as a stack in a first direction and a width of the first tunnel barrier layer, a width of the free magnetic layer, a width of the second tunnel barrier layer and a width of the second reference magnetic layer in a second direction are less than about 30 nm, the second direction being substantially perpendicular to the first direction, so that the free magnetic layer has a magnitude of an in-plane magnetostatic field of less than about 500 Oe at an edge of the free magnetic layer,
wherein the first reference magnetic layer comprises:
a first pinned magnetic layer;
a first polarization enhancement layer; and
a first texture blocking layer between the first pinned magnetic layer and the first polarization enhancement layer,
wherein the first texture blocking layer includes Ta, W, Mo, Nb, Ir, or Os, and wherein the second reference magnetic layer comprises:
a second pinned magnetic layer;
a second polarization enhancement layer; and
a second texture blocking layer between the second pinned magnetic layer and the second polarization enhancement layer, and
wherein the second texture blocking layer includes Ta, W, Mo, Nb, Ir, or Os,
wherein the first pinned magnetic layer and the second pinned magnetic layer includes Co/Pt, Co/Pd, Co/Ir, Co/Ru, Co/Os, Fe/W, Co/W or Co/Ni with a thickness of between about 1.5 nm and about 15 nm.

2. The magnetic memory device according to claim 1, wherein the first pinned magnetic layer and the first polarization enhancement layer are anti-ferromagnetically coupled.

3. The magnetic memory device according to claim 1, wherein the first pinned magnetic layer is a pinned ferrimagnetic layer and the second pinned magnetic layer is a pinned ferrimagnetic layer.

4. The magnetic memory device according to claim 1, further comprising a self-initializing magnetic layer on the second tunnel barrier layer.

5. The magnetic memory device according to claim 1, wherein a width of the first reference magnetic layer in the second direction is greater than or equal to about three times a width of the first tunnel barrier layer, the free magnetic layer, the second tunnel barrier layer and the second reference magnetic layer in the second direction is less than about 30 nm.

6. A magnetic memory device, comprising:
a first reference magnetic layer;
a first tunnel barrier layer on the first reference magnetic layer;
a second tunnel barrier layer;
a free magnetic layer disposed between the first tunnel barrier layer and the second tunnel barrier layer;
a second reference magnetic layer on the second tunnel barrier layer,
wherein the first reference magnetic layer, the first tunnel barrier layer, the free magnetic layer, the second tunnel barrier layer, and the second reference magnetic layer are arranged as a stack in a first direction,
wherein a width of the first tunnel barrier layer, a width of the free magnetic layer, a width of the second tunnel barrier layer and a width of the second reference magnetic layer in a second direction are less than about 30 nm, the second direction being substantially perpendicular to the first direction, wherein a magnitude of an in-plane magnetostatic field from the first reference magnetic layer at an edge of the free magnetic layer is less than about 500 Oe,
wherein the first reference magnetic layer comprises:
a first pinned magnetic layer;
a first polarization enhancement layer; and
a first texture blocking layer between the first pinned magnetic layer and the first polarization enhancement layer,
wherein the first texture blocking layer includes Ta, W, Mo, Nb, Ru, Cr, Ir, Os or Rh, and
wherein the first pinned magnetic layer includes Co/Pt, Co/Pd, Co/Ir, Co/Ru, Co/Os, Fe/W, Co/W or Co/Ni with a thickness of between about 1.5 nm and about 15 nm.

7. The magnetic memory device according to claim 6, wherein the first pinned magnetic layer and the first polarization enhancement layer are anti-ferromagnetically coupled.

8. The magnetic memory device according to claim 6, wherein the second reference magnetic layer comprises: a second pinned magnetic layer;
a second polarization enhancement layer; and
a second texture blocking layer between the second pinned magnetic layer and the second polarization enhancement layer.

9. The magnetic memory device according to claim 8, wherein the first pinned magnetic layer is a pinned ferrimagnetic layer and the second pinned magnetic layer is a pinned ferrimagnetic layer.

10. The magnetic memory device according to claim 6, further comprising a self-initializing magnetic layer on the second tunnel barrier layer.

11. The magnetic memory device according to claim 6, wherein a width of the first reference magnetic layer in the second direction is greater than or equal to about three times a width of the first tunnel barrier layer, the free magnetic layer, the second tunnel barrier layer and the second reference magnetic layer in the second direction is less than about 30 nm.

12. A memory device, comprising:
a plurality of memory cells arranged in an array; and
an interface coupled to the plurality of memory cells to receive data to be stored in at least one memory cell and to output data from at least one memory cell,
at least one memory cell comprising a magnetic memory device, comprising:
a first reference magnetic layer;
a first tunnel barrier layer on the first reference magnetic layer;
a second tunnel barrier layer;
a free magnetic layer disposed between the first tunnel barrier layer and the second tunnel barrier layer; and
a second reference magnetic layer on the second tunnel barrier layer,
wherein the first reference magnetic layer, the first tunnel barrier layer, the free magnetic layer, the second tunnel barrier layer and the second reference magnetic layer are arranged as a stack in a first direction, and a width of the first tunnel barrier layer, a width of the free magnetic layer, a width of the second tunnel barrier layer and a width of the second reference magnetic layer in a second direction are less than about 30 nm, the second direction being substantially perpendicular to the first direction, so that a magnitude of an in-plane magnetostatic field from the first reference magnetic layer at an edge of the free magnetic layer is less than about 500 Oe,
wherein the second reference magnetic layer comprises:
a second pinned magnetic layer;
a second polarization enhancement layer; and
a second texture blocking layer between the second pinned magnetic layer and the second polarization enhancement layer,
wherein the second texture blocking layer includes Ta, W, Mo, Nb, Ir, or Os, and
wherein the second pinned magnetic layer includes Co/Pt, Co/Pd, Co/Ir, Co/Ru, Co/Os, Fe/W, Co/W or Co/Ni with a thickness of between about 1.5 nm and about 15 nm.

* * * * *